United States Patent [19]

Rao

[11] Patent Number: 5,298,451
[45] Date of Patent: Mar. 29, 1994

[54] RECESSED AND SIDEWALL-SEALED POLY-BUFFERED LOCOS ISOLATION METHODS

[75] Inventor: Kalipatnam V. Rao, Avezzano, Italy

[73] Assignee: Texas Instruments Incorporated, Dallas, Tex.

[21] Appl. No.: 693,747

[22] Filed: Apr. 30, 1991

[51] Int. Cl.⁵ .............................................. H01L 21/76
[52] U.S. Cl. .......................................... 437/70; 437/72
[58] Field of Search ................................... 437/72, 70; 148/DIG. 85, DIG. 86, DIG. 117

[56] References Cited

FOREIGN PATENT DOCUMENTS

| | | | |
|---|---|---|---|
| 61-247051 | 11/1986 | Japan . | |
| 62-71247 | 4/1987 | Japan . | |
| 62-211938 | 9/1987 | Japan | 437/72 |
| 63-253640 | 10/1988 | Japan . | |
| 1-125845 | 5/1989 | Japan . | |

OTHER PUBLICATIONS

Wolf, S., et al, *Silicon Processing for the VLSI Era; vol. 2: Process Integration,* 1990, pp. 43-44.
Ghandhi, S., *VLSI Fabrication Principles,* 1983, p. 360.

Primary Examiner—George Fourson
Attorney, Agent, or Firm—Carlton H. Hoel; Richard A. Stoltz; Richard L. Donaldson

[57] ABSTRACT

This is a method for forming a recessed LOCOS isolation region, which includes the steps of forming a first silicon nitride layer between the pad oxide layer and a polysilicon buffer layer and a second nitride layer over the polysilicon buffer layer. In addition, the method for forming LOCOS isolation regions can include the additional steps of forming a sidewall seal around the perimeter of the active moat regions prior to the field oxidation step. The resulting field oxide isolation regions have provided a low-profile recessed field oxide with reduced oxide encroachment into the active moat region.

8 Claims, 1 Drawing Sheet

RECESSED AND SIDEWALL-SEALED POLY-BUFFERED LOCOS ISOLATION METHODS

NOTICE (C) Copyright, Texas Instruments Incorporated 1991. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

CROSS-REFERENCE TO RELATED APPLICATIONS

The coassigned patent applications entitled "Sidewall-Sealed Poly-Buffered LOCOS Isolation", serial number 244,968, filed Sep. 15, 1988; "Side-wall-Sealed and Sandwiched Poly-Buffered Locos Isolation" Ser. No. 07/693,821; "Recessed and Sidewall-Sealed Poly-Buffered Locos Isolation" Ser. No. 07/693,511, filed concurrently with this application, all now abandoned, are hereby incorporated herein by reference as background and supporting information to the subject matter discussed. All are assigned to Texas Instruments.

FIELD OF THE INVENTION

The present invention relates generally to semiconductor isolation methods and regions and, more particularly, to LOCOS isolation methods and regions.

BACKGROUND OF THE INVENTION

Advanced VLSI-class semiconductor devices are being designed with sub-micron moat-to-moat spacing. Working (or active) semiconductor devices are fabricated on the moat region on the semiconductor wafer. These devices must be adequately isolated from one another to prevent adverse interaction (e.g., leakage current or shorting) between these devices. A well known technique for forming isolation regions between the moat regions is the LOCOS field oxidation technique, which has become an industry mainstay. Conventional LOCOS techniques, however, have been inadequate or marginal at best when used with sub-micron VLSI products. In particular, "moat encroachment" (also known as "bird's beaking") is a major problem. It is caused be lateral oxidation into the moat regions during field oxide growth. This encroachment at moat edges and corners results in a drastic decrease of moat dimensions and is severely detrimental for maintaining sub-micron moat-to-moat geometries.

Several isolation techniques have been developed in recent years for use with VLSI CMOS and BiCMOS products. For instance, the Poly-Buffered LOCOS (PBL) Isolation technique is currently used with VLSI designs having 1.2 micron minimum moat-to-moat spacing. Poly-buffered LOCOS is a modification to the industry standard LOCOS isolation process. The modification includes the step of adding a thin buffer layer of polysilicon (poly) between the underlying pad oxide and the overlying moat nitride film. The polysilicon layer allows the use of a thick moat nitride film during the field oxidation process by relieving stresses in the silicon lattice normally present during LOCOS oxidation.

SUMMARY OF THE INVENTION

In accordance with the teaching of the present invention, the disclosed recessed and sidewall-sealed poly-buffered LOCOS process reduces or eliminates the disadvantages and shortcomings associated with relevant prior art methods for forming localized isolation regions for VLSI technology. In one embodiment, using photolithography, plasma etch, and channel stop implant steps, the present invention comprises the steps of forming a pad layer of silicon dioxide on a semiconductor body or substrate; a polysilicon layer is thereafter formed on the pad layer of silicon dioxide; a a silicon nitride layer is thereafter formed on the polysilicon layer. A nitride sidewall seal is formed thereafter around the perimeter of the semiconductor moat regions. Following this, a trench is etched into the semiconductor substrate in the inverse moat region after formation of the nitride side-wall. LOCOS field oxidation techniques are used to grow the isolation oxide. A preferred embodiment places a pad oxide buffer layer between the nitride sidewall and the semiconductor body.

BRIEF DESCRIPTION OF THE DRAWINGS

Further features and advantages will become apparent from the following and more particular description of the various embodiments of the invention, as illustrated in the accompanying drawing, wherein.

DESCRIPTION OF THE PREFERRED EMBODIMENTS

Figure 1:
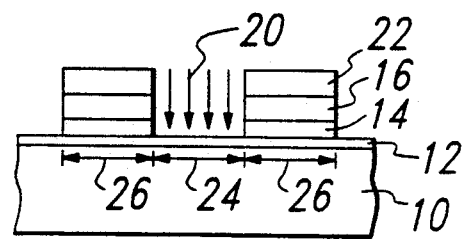
FIG. 1 is a cross-sectional view of a wafer illustrating a formation step of the isolation and active device regions before the sidewalls have been added and before the recess is created.

Although an improvement over the conventional LOCOS technique, PBL has been found to have its own set of problems and limitations. Specifically, in addition to the usual bird's beak oxide (termed hereafter as the first bird's beak), the PBL technique results in the formation of a "second bird's beak" oxide, associated with lateral encroachment into moat regions during field oxidation. The first bird's beak oxide is due to the combined effects of oxidation of moat silicon as well as oxidation of the bottom surface of poly buffer film, at the moat edges and corners. The second bird's beak oxide is the result of oxidation of the top surface of the poly buffer film at moat edges and corners. Additionally, during moat etch sequence, which usually follows field oxidation, this second bird's beak oxide acts as a mask during high-selectivity plasma-etching of the poly film, thus hindering successful removal of the poly film at moat edges and corners. This phenomenon of second bird's beak oxide thus severely limits the applicability of PBL to about 1.2 to 1.0 micron moat-to-moat widths.

The present inventor addressed this bird's beak phenomenon in his co-pending patent application entitled "Sidewall-Sealed Poly-Buffered LOCOS Isolation", Ser. No. 244,968, filed Sep. 15, 1988, now abandoned, and "Sidewall-Sealed and Sandwiched Poly-Buffered LOCOS Isolation", filed recently. Both inventions are assigned to applicant's assignee. The contents of said application are hereby incorporated herein by reference. The Sidewall-Sealed Poly Buffered LOCOS isolation (SSPBL) technique is a modification of the original PBL process. The modifications include forming nitride sidewalls all along the moat perimeter prior to field oxidation. In the SSPBL technique, stress-related defects are generally avoided in the underlying silicon. In addition, SSPBL also includes other modifications to the original PBL process, such as the use of a thicker pad oxide, optional high pressure oxidation during field oxidation, and also an improved moat etch sequence.

The sidewall nitride in the SSPBL technique essentially eliminates formation of the second bird's beak by acting as an oxidation mask during field oxidation. The absence of this second bird's beak permits successful plasma-etching of poly-buffer film during the post-field oxidation moat etch sequence. Although the first bird's beak oxide is still present, it can be sufficiently removed by a controlled deglaze in a dilute (10%) HF solution. Excessive deglaze, on the other hand, will result in undesirable retrograde profiles of the field oxide/moat interface region.

The sidewall-sealed poly buffered LOCOS technique is applicable for VLSI designs having 1.2 to 0.5-micron moat-to-moat widths. Improved semiconductor isolation process techniques are needed for moat dimensions below 0.5 um without degrading performance or the useful area of the active region. For such applications, improvements to SSPBL have been made as described in this invention.

Referring now to the drawings, wherein like reference characters designate like or corresponding parts throughout the several views, FIG. 1 depicts a resultant intermediate structure in the process for forming sidewall-sealed and sandwiched poly-buffered LOCOS isolation regions. As shown in FIG. 1, preferably a 12-15 nanometer pad silicon dioxide layer 12 is grown on a conventional silicon semiconductor substrate or body 10. Subsequently, a polysilicon layer 14 is deposited over said first nitride layer by low-pressure chemical vapor deposition (LPCVD) to approximately 50 nanometers. Thereafter, a silicon nitride layer 16 is deposited over polysilicon layer 14 by low-pressure chemical vapor deposition (LPCVD) to a thickness of approximately 240 to 300 nanometers. Next, an inverse-moat region 18 is patterned in accordance with standard photo-lithographic techniques; the area 26 beneath the non-exposed photoresist 22 defines the active device moat region. The nitride and polysilicon layers over the inverse-moat region 24 are thereafter plasma etched to expose the pad oxide over the inverse moat regions 24, as shown. Next, a boron channel-stop implant 20 is performed in the inverse-moat regions 18. The photoresist 22 is thereafter removed by a plasma-ash, piranha-strip and pre-furnace clean-up.

Figure 2:
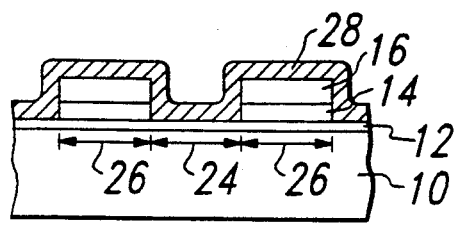
FIG. 2 is a cross-sectional view of the FIG. 1 structure showing semiconductor material (e.g. nitride) disposed on the wafer for formation of a sidewall seal.

FIG. 2 illustrates an intermediate step in the process to form sidewall seals around the sacrificial films of the polysilicon and nitride layers. In particular, FIG. 2 shows a 30-90 nanometer layer of silicon nitride 28 deposited over the wafer by low-pressure chemical-vapor deposition. The wafer is thereafter subjected to an anisotropic blanket etch. This step etches away the silicon nitride and pad oxide in the inverse moat regions, leaving a thin 30-90 nanometer silicon nitride sidewall seal 30 along the perimeter of the moat region 26. The nitride sidewall generally seals the moat edges from oxygen diffusion during formation of the isolation field oxide in the inverse moat region. The sealing of the moat region substantially reduces the amount of oxide encroachment associated with conventional LOCOS processing.

Figure 3:
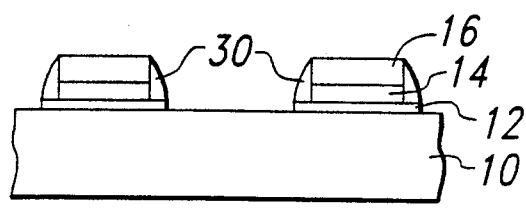
FIG. 3 is a cross-sectional view of the formed FIG. 2 structure showing the sidewall seal.

FIG. 3 illustrates the preferred embodiment of the recessed and sidewall-sealed Poly-buffered LOCOS isolation regions. As shown in FIG. 3, the anisotropic etch results in a pad oxide edge 32 remaining beneath the nitride sidewall which aids in relieving stresses in the underlying silicon 10 during the formation of the isolation field oxide.

Figure 4:
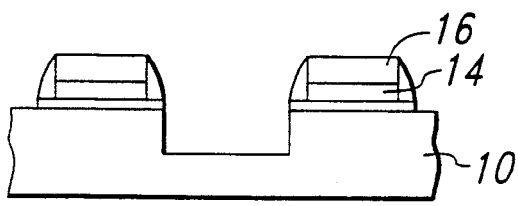
FIG. 4 is a cross-sectional view of FIG. 3, after the recess in the inverse moat region has been created.

As shown in FIG. 4, the silicon recess with vertical or slanted sidewalls is then etched in the inverse moat region without destroying the sidewall nitride seals. The depth of the trench may range from 3000-15000 nanometers, depending upon the ultimate height of the field oxide. Thereafter, a second channel stop implant may supplement the first channel-stop implant. Alternatively, this can act as the sole channel-stop implant after the silicon recess step. Recessing provides a low profile field oxide topography. By comparison, a high profile field oxide inhibits the placement and control of subsequent layers and interconnect levels. In addition, high profile field oxide regions must be leveled out. These additional complications necessitate additional pre-metalization planarizing steps, for successful process integration of VLSI CMOS devices.

Figure 5:
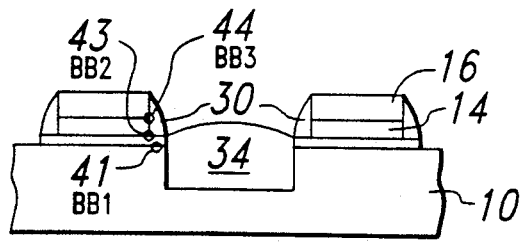
FIG. 5 is a cross-sectional view of FIG. 4 illustrating the bird's beaking locations after the growth of the field oxide in the isolation region.

FIG. 5 is a cross-sectional view of FIG. 4 illustrating the bird's beaking locations after the growth of the field oxide in the isolation region. As shown in FIG. 5, the isolation field oxide 34 is grown to approximately 800 to 850 nanometers in accordance with the present method, by subjecting the wafer to a high-pressure, approximately 10 Atm., oxidation at an elevated temperature of approximately 975 degrees C. This combination of pressure and temperature aids to minimize both the time required as well as the encroachment, and deters the spreading of the channel-stop implant into the active moat regions. Conventional steam oxidation at 900 degrees C. may also be used in accordance with the present invention, if boron dopant spreading is not a major concern. Channel-stop implants may also be formed in said inverse-moat regions after anisotropically etching said silicon nitride layer or after growing the field oxide in said inverse moat region, as required to optimize the overall process to achieve desired set of device electrical parameters.

In addition, FIG. 5 shows the bird's beak locations, if sidewall seals 30 are used. The nitride sidewall 30 significantly reduces oxidation at the BB3 44 and the BB2 43 locations associated with the various versions of poly buffered LOCOS processes described previously, namely PBL and SPBL. The reduction of these several encroachments or bird's beaks greatly simplifies the successful removal of polysilicon layer 14 at the active moat edges during a subsequent high-selectivity plasma etch to expose the active moat region 26.

In prior art methods (PBL isolation technology), the oxide on top of the polysilicon layer, comprising the second bird's beak oxide at the edges, shields the edges of the polysilicon and inhibits its successful removal. The polysilicon layer over the middle of the active region is completely removed before all the edge polysilicon can be eliminated. These edge particles of polysilicon leave small foot-prints, referred to as "scalloping," around the moat edges, especially at narrow moat corners where the severity of bird's beak formation is the worst.

Figure 6:
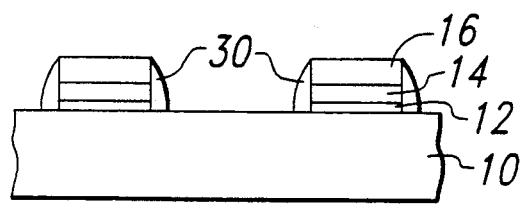
FIG. 6 is a cross-sectional view of an alternative embodiment of FIG. 3 illustrating the elimination of the pad oxide layer between the sidewall seal and the wafer.
Figure 7:
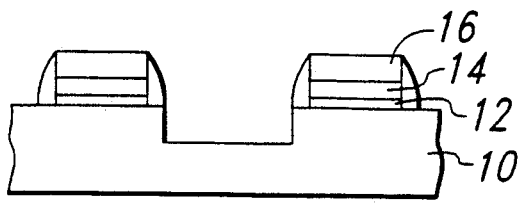
FIG. 7 is a cross-sectional view of FIG. 6, after the recess in the inverse moat region has been created.

An alternative embodiment of the present invention is shown in FIG. 6. As shown, the pad oxide in the inverse-moat regions may be completely removed by plasma etching after removal of the silicon nitride and polysilicon layers. Thus, the subsequent sidewall formation will not include edge portion 32 of the pad oxide depicted in FIG. 3. FIG. 7 demonstrates this alternative embodiment with the sidewall change after the creation of the recess. The field oxide is then grown in the recess as in the other embodiments.

In accordance with the teachings of the present invention, the features of the active moat regions are further improved by a novel processing sequence to expose the active moat region. The field oxidation step is very likely to form a thin oxynitride skin over the moat nitride layer (about 17 nanometers thick, following the 975 degrees C., 10 Atm. high-pressure oxidation). When processing sequences have attempted to remove this skin concurrently with the removal of the deposited top nitride layer, crust formations occur along the edges of the active region due to unsuccessful and incomplete stripping of the top nitride film from moat regions. This crusting further degrades the amount and quality of the active moat region. This crusting can be eliminated by a sufficient deglazing of the wafer to strip off all of the oxynitride skin, before attempting the removal of the moat nitride layer. This can be performed by subjecting the wafer to 10% HF at room temperature for approximately 2 minutes. This deglaze will ensure that all of the oxynitride skin following the oxidation is removed.

After the deglaze, the moat nitride is removed by acid stripping in a hot phosphoric bath of approximately 175 to 182 degrees C. for approximately 90 minutes. The longer etch time at this temperature, in comparison to the conventional 60 minute etch of conventional PBL, ensures that all of the moat nitride layer and the sidewall nitride are removed.

After the removal of the sidewall nitride, the wafer is subjected to a high-selectivity isotropic blanket plasma etch with SF6 (Sulfur-Hexa-Fluoride) gas to remove the polysilicon layer. This plasma-etch step in combination with the use of the thicker pad oxide layer helps to prevent silicon pitting (detrimental etching) of the active moat region. The use of the nitride layers 40 and 16 enhances the present poly-buffered LOCOS process by minimizing the second and third bird's beak oxide 43 and 44 (i.e., the oxide that forms on both the upper and lower surfaces of the polysilicon film at the edges, due to the combined oxidation of the moat silicon and the underside of the poly buffer film at the moat-field oxide interfaces) and to some extent the upper subcomponent of the first bird's beak at location 41 oxide (i.e., the oxide that forms on the upper surface of the pad oxide). The use of the nitride sidewall deposition after the inverse moat oxide plasma etch further enhances the present poly-buffered LOCOS process by minimizing the second and the third bird's beak oxide at locations 43 and 44, respectively.

Figure 8:
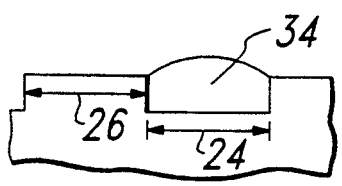
FIG. 8 is a cross-sectional view, after the growth of the field oxide and the removal of all layers from the moat region.

After the removal of the first moat nitride 40, the moat pad oxide 12 is stripped off and the wafer is subjected to a megasonic clean up to ensure that any un-oxidized and un-etched polysilicon granulites are effectively removed. The active region, 26 in FIG. 1, is now ready for the formation of the sacrificial gate oxide, Vt-adjust implant, and the subsequent gate oxidation and LPCVD polysilicon gate deposition. FIG. 8 illustrates the final cross-section of this device after all the process steps.

Another embodiment of the present invention is to avoid the formation of any thin oxide layers between the moat polysilicon and nitride films. This can be achieved in accordance with the teachings of the present invention by avoiding any piranha or megasonic (RCA-type) $NH_4OH$—$H_2O_2$—$H_2O$ (Ammonium-Hydroxide-Hydrogen-Peroxide-Water) like cleanups before the inverse-moat nitride deposition or after the moat nitride strip. This prevents any excessive native oxide build-up on the top surface of the polysilicon buffer film. If there are any oxides on top of the poly film, they may not etch off during the $SF_6$ (Sulfur-Hexa-Fluoride) high-selectivity polysilicon plasma-etch process, thus making it difficult to remove the underlying polysilicon film 14 during the moat-etch sequence.

Additionally, the use of the recess as well as the nitride sidewall seals prior to field oxidation aids the polysilicon etch process (during the moat etch sequence), by avoiding the second and third bird's beak oxide that has occurred in the prior-art on the poly surfaces around the edges. This additionally avoids any scalloping problems in the narrow moat corners which has been experienced in the prior-art conventional poly buffered LOCOS.

The values and ranges disclosed herein are given for a preferred embodiment of the present invention, of course these values may vary as the parameters are changed. Therefore, it is to be understood that many changes in detail may be made as a matter of engineering choices without departing from the spirit and scope of the invention, as defined by the appended claims. Other dopants may be used for channel stop implant, such as a Phosphorous, Germanium, and Germanium/-Boron. Likewise, other diffusion barriers may be used for the sidewalls or nitride layers, in addition to nitride, such as silicon dioxide or polysilicon. The present recessed, and sidewall-sealed poly-buffered LOCOS process can be used in conjunction with Germanium/Boron channel stop implant to fabricate high-voltage VLSI devices such as EPROMS, EEPROMS. In addition, the channel-stop implant can be placed into the silicon at one or more of the various steps involved in device fabrication. For example, the channel-stop implant can be done right after plasma-etching of inverse-moat stack (of poly or nitride layers) with the photoresist still in place. Optionally, the channel-stop implant may be placed alternatively after the field oxidation process, using high-energy implants. The choice of placement of channel stop implant in the overall process sequence depends on the need to optimize the device electrical parameters.

TECHNICAL ADVANTAGES OF THE INVENTION

From the foregoing the fabrication steps of an improved poly-buffered LOCOS (PBL) isolation region has been disclosed. A technical advantage of the invention is the efficient utilization of the field oxide for isolation purposes. In particular, recessing provides a low profile field oxide topography, which is desirable. A high profile field oxide reduces the effectiveness of the isolation region and makes the placement and control of subsequent layers and interconnect levels much more difficult. High profile field oxide regions must be leveled out as well, which further complicates the manufacturing process by necessitating other pre-metalization planarizing steps during VLSI CMOS process integration. The low-profile field oxide topography is compatible with double/triple-poly, multi-level metal interconnect schemes.

Another technical advantage of the disclosed isolation process is that a substantial amount of the lateral encroachment generally known as bird's beaks has been eliminated without degrading the operational characteristics of the active region. Therefore, an attendant technical advantage of the present encroachment reduction process is that it facilitates the successful fabrication of VLSI technologies with smaller design rules.

Another technical advantage of the invention presented is that detrimental processing steps, which result in excessive pitting, scalloping and crusting of the active region and which reduce the amount of usable active moat area, have been eliminated or reduced. Furthermore, the excessive corner loss of active device regions experienced in prior art processes due to two-dimensional oxidation has been substantially suppressed with the present invention. Another attendant technical advantage is that little or no unusable moat area need be compensated for in the processing sequence.

What is claimed is:

1. A method for forming a semiconductor device, comprising the steps of:
   (a) providing a semiconductor body;
   (b) forming a pad oxide layer on said semiconductor body;
   (c) forming a polysilicon nitride layer on said polysilicon layer;
   (d) forming a silicon nitride layer on said polysilicon layer;
   (e) coating a masking material over said silicon nitride layer;
   (f) placing a mask over said silicon nitride layer, wherein said mask shields certain portions of said masking material;
   (g) removing said masking material not shielded by said mask, thereby defining a plurality of inverse moat regions and a plurality of active moat regions, said plurality of inverse moat regions lacking said masking material over said silicon nitride layer and said plurality of active moat regions having said masking material over said silicon nitride layer;
   (h) plasma etching to remove said polysilicon layer and said silicon nitride layer in said plurality of inverse moat regions;
   (i) striping said masking material from said silicon nitride layer in said plurality of active moat regions;
   (j) forming by low-pressure chemical vapor deposition a conformal silicon nitride layer over said pad oxide layer on said semiconductor body in said plurality of inverse moat regions;
   (k) anisotropically etching said conformal silicon nitride layer, leaving a plurality of silicon nitride sidewalls on edges of said polysilicon layer and said silicon nitride layer;
   (l) forming trenches in said semiconductor body adjacent to said silicon nitride sidewalls in said inverse moat regions;
   (m) forming a first channel-stop implant in said inverse moat regions; and
   (n) growing a field oxide in said inverse moat regions in said trenches, wherein steps (j) and (k) are performed before step (l).

2. The method of claim 1, comprising performing step (m) after step (h).

3. The method of claim 1, further comprising the following step after step (k)
   (k1) forming a second channel-stop implant in said inverse-moat regions.

4. The method of claim 1, further comprising the steps of:
   (o) deglazing said layered semiconductor body to strip off an oxynitride skin on said silicon nitride layer;
   (p) removing said silicon nitride layer and said plurality of silicon nitride sidewalls in said plurality of active moat regions;
   (q) removing said polysilicon layer in said plurality of active moat regions; and
   (r) removing said pad oxide in said plurality of active moat regions.

5. A method for forming a semiconductor device, comprising the steps of:
   (a) providing a semiconductor body;
   (b) forming a pad oxide layer on said semiconductor body;
   (c) forming a polysilicon layer on said pad oxide layer;
   (d) forming a silicon nitride layer on said polysilicon layer;
   (e) coating a masking material over said silicon nitride layer;
   (f) placing a mask over said silicon nitride layer, wherein said mask shields certain portions of said masking material;
   (g) removing said masking material not shielded by said mask, thereby defining a plurality of inverse moat regions and a plurality of active moat regions, said plurality of inverse moat regions lacking said masking material over said silicon nitride layer and said plurality of active moat regions having said masking material over said silicon nitride layer;
   (h) plasma etching to remove said polysilicon layer, said silicon nitride layer and said pad oxide layer in said plurality of inverse moat regions;
   (i) striping said masking material from said silicon nitride layer in said plurality of active moat regions;
   (j) forming by low-pressure chemical vapor deposition a conformal silicon nitride layer over said pad oxide layer on said semiconductor body in said plurality of inverse moat regions;
   (k) anisotropically etching said conformal silicon nitride layer, leaving a plurality of silicon nitride sidewalls on edges of said polysilicon layer and said silicon nitride layer;

(l) forming trenches in said semiconductor body adjacent to said silicon nitride sidewalls in said inverse moat regions;

(m) growing a field oxide in said inverse moat regions in said trench; and (n) forming a first channel-stop implant in said inverse-moat regions, wherein steps (j) and (k) are performed before step (l).

6. The method of claim 5, comprising performing step (n) after step (h).

7. The method of claim 5, further comprising the following step after step (k)

(k1) forming a second channel-stop implant in said inverse-moat regions.

8. The method of claim 5, further comprising the steps of:

(o) deglazing said layered semiconductor body to strip off an oxynitride skin on said silicon nitride layer;

(p) removing said silicon nitride layer and said plurality of silicon nitride sidewalls in said plurality of active moat regions;

(q) removing said polysilicon layer in said plurality of active moat regions; and (r) removing said pad oxide in said plurality of active moat regions.

* * * * *